United States Patent
Pindicura et al.

(10) Patent No.: US 11,562,116 B2
(45) Date of Patent: Jan. 24, 2023

(54) DETECTING DEVIATIONS FROM TARGETED DESIGN PERFORMANCE IN ACCELERATOR/EMULATOR ENVIRONMENT

(71) Applicant: International Business Machines Corporation, Armonk, NY (US)

(72) Inventors: Tharunachalam Pindicura, Austin, TX (US); Yan Xia, Austin, TX (US); Karen Yokum, Austin, TX (US); Vivek Britto, Austin, TX (US); Shricharan Srivatsan, Austin, TX (US); Aishwarya Dhandapani, Folson, CA (US)

(73) Assignee: International Business Machines Corporation, Armonk, NY (US)

( * ) Notice: Subject to any disclaimer, the term of this patent is extended or adjusted under 35 U.S.C. 154(b) by 324 days.

(21) Appl. No.: 16/922,514

(22) Filed: Jul. 7, 2020

(65) Prior Publication Data
US 2022/0012393 A1    Jan. 13, 2022

(51) Int. Cl.
*G06F 30/331* (2020.01)
*G06F 30/333* (2020.01)
(Continued)

(52) U.S. Cl.
CPC .......... *G06F 30/331* (2020.01); *G06F 9/3877* (2013.01); *G06F 11/1407* (2013.01); *G06F 11/3652* (2013.01); *G06F 30/333* (2020.01)

(58) Field of Classification Search
CPC .. G06F 30/331; G06F 9/3877; G06F 11/1407; G06F 11/3652; G06F 30/333;
(Continued)

(56) References Cited

U.S. PATENT DOCUMENTS 5,146,460 A    9/1992  Ackerman et al.
5,297,274 A    3/1994  Jackson
(Continued)

OTHER PUBLICATIONS

Chiou et al., "FPGA-Accelerated Simulation Technologies (FAST): Fast, Full-System, Cycle-Accurate Simulators," Proceedings of the 40th Annual IEEE/ACM International Symposium on Microarchitecture (MICRO 40). IEEE Computer Society, Washington, DC, USA, Conference Date: Dec. 1-5, 2007, pp. 249-261.

(Continued)

*Primary Examiner* — Stacy Whitmore
(74) *Attorney, Agent, or Firm* — Scully, Scott, Murphy & Presser, P.C.

(57) ABSTRACT

Embodiments of the present disclosure provide a method, a system, and a computer readable storage medium for detecting deviations from targeted design performance in accelerator/emulator environment. In an embodiment, the method comprises loading target vales for a performance metric onto a hardware-accelerated simulator; setting breakpoints to pause the simulator at defined intervals; simulating, by the hardware-accelerated simulator, execution of a circuit design. The method further comprises during the simulating, using said breakpoints to pause the simulating at the defined intervals, and during each pause, comparing a measured value for the performance metric to the target value for the performance metric; and ending the simulation when a specified condition based on said comparing is met. In embodiments, when a difference between the measured value for the performance metric and the target value for the performance metric is within a preset tolerance, the pause is ended and the simulation continues.

17 Claims, 4 Drawing Sheets

ALGORITHM FOR TRIGGERING PERFORMANCE CHECKPOINTS

(51) Int. Cl.
  *G06F 9/38* (2018.01)
  *G06F 11/14* (2006.01)
  *G06F 11/36* (2006.01)
(58) Field of Classification Search
  CPC ............ G06F 11/3466; G06F 11/3636; G06F 11/3428
  See application file for complete search history.

(56) References Cited

U.S. PATENT DOCUMENTS

| | | | |
|---|---|---|---|
| 6,854,073 B2 | 2/2005 | Bates et al. | |
| 7,529,897 B1 * | 5/2009 | Waldspurger | G06F 11/1435 714/13 |
| 7,827,510 B1 * | 11/2010 | Schubert | G06F 30/331 716/111 |
| 9,317,636 B1 | 4/2016 | Petras et al. | |
| 9,747,396 B1 * | 8/2017 | Chatterjee | G06F 30/331 |
| 10,255,400 B1 * | 4/2019 | Villarreal | G06F 30/327 |
| 11,295,051 B2 * | 4/2022 | Muthiah | G06F 30/30 |
| 2007/0005323 A1 | 1/2007 | Patzer et al. | |
| 2013/0179142 A1 | 7/2013 | Kim et al. | |
| 2017/0176529 A1 * | 6/2017 | Batra | G06F 30/33 |
| 2018/0059182 A1 * | 3/2018 | Batra | G01R 31/3177 |
| 2020/0151085 A1 * | 5/2020 | Mola | G06F 11/3664 |
| 2020/0174910 A1 * | 6/2020 | Mola | G06F 16/901 |
| 2020/0319974 A1 * | 10/2020 | Lacey | G06F 9/3867 |
| 2022/0004680 A1 * | 1/2022 | Schumann | G06F 30/3312 |

OTHER PUBLICATIONS

Chatterjee et al., "Checking architectural outputs instruction-by-instruction on acceleration platforms," Proceedings of the 49th Annual Design Automation Conference (DAC '12). DAC 2012, Jun. 3-7, 2012, San Francisco, California, USA, ACM, New York, NY, USA, pp. 955-961.

* cited by examiner

DETECTING DEVIATIONS FROM TARGETED DESIGN PERFORMANCE IN ACCELERATOR/EMULATOR ENVIRONMENT

BACKGROUND

This invention, generally, relates to simulation environments, and more specifically, to hardware accelerated simulation environments.

Accelerator/Emulator environments are often used to verify the performance of processors and other circuits. This environment allows running long and complex performance benchmarks. But at the same time detecting performance bugs is harder due to limited visibility into the simulation.

SUMMARY

According to an embodiment of the present invention, a method comprises loading a list of target values for a performance metric onto a hardware-accelerated simulator; setting breakpoints to pause the hardware-accelerated simulator at defined intervals; simulating, by the hardware-accelerated simulator, execution of a circuit design; during the simulating, using said breakpoints to pause the simulating at the defined intervals, and during each pause, comparing a measured value for the performance metric to the target value for the performance metric; and ending the simulation when a specified condition based on said comparing is met.

In embodiments, the comparing a measured value for the performance metric to the target value for the performance metric includes at an end of each of the intervals, comparing the measured value for the performance metric to the target value for the performance metric, and when a difference between the measured value for the performance metric and the target value for the performance metric is within a preset tolerance, ending the each pause and continuing the simulating execution of the circuit design.

In embodiments, the simulating, by the hardware-accelerated simulator, execution of a circuit design includes collecting a checkpoint of the execution of the circuit design at a start of each of the intervals; and when the difference between the measured value for the performance metric and the target value for the performance metric is within a preset tolerance, deleting the collected checkpoint.

In embodiments, the comparing a measured value for the performance metric to the target value for the performance metric further includes when the difference between the measured value for the performance metric and the target value for the performance metric is outside the preset tolerance, incrementing a count, comparing the incremented count to a preset limit, and when the incremented count does not exceed the preset limit, ending the each pause and continuing the simulating execution of the circuit design.

In embodiments, the simulating, by the hardware-accelerated simulator, execution of a circuit design further includes when the difference between the measured value for the performance metric and the target value for the performance metric is outside the preset tolerance, saving the collected checkpoint.

In embodiments, the ending the simulation when a specified condition based on said comparing is met includes ending the simulation when the number of the saved checkpoints exceeds a preset limit.

According to an embodiment of the present invention, a system comprises a processor; and a memory, storing program code, which when executed on the processor, performs an operation of circuit design verification. The operation comprises loading a list of target values for a performance metric onto a hardware-accelerated simulator; setting breakpoints to pause the hardware-accelerated simulator at defined intervals; simulating, by the hardware-accelerated simulator, execution of a circuit design; during the simulating, using said breakpoints to pause the simulating at the defined intervals, and during each pause, comparing a measured value for the performance metric to the target value for the performance metric; and ending the simulation when a specified condition based on said comparing is met.

According to an embodiment of the present invention, a computer readable storage medium having stored thereon instructions that when executed by a processor causes the processor to perform an operation for circuit design verification comprises loading a list of target values for a performance metric onto a hardware-accelerated simulator; setting breakpoints to pause the hardware-accelerated simulator at defined intervals; simulating, by the hardware-accelerated simulator, execution of a circuit design; during the simulating, using said breakpoints to pause the simulating at the defined intervals, and during each pause, comparing a measured value for the performance metric to the target value for the performance metric; and ending the simulation when a specified condition based on said comparing is met.

Embodiments of the invention periodically monitor performance metrics (like IPC) during accelerated simulation (optimized design model). These measured values are compared to preset target values. Any deviation from the target that exceeds a tolerance will trigger a simulation checkpoint save. These saved checkpoints can be used to produce the behavior in simulation (full design model).

DETAILED DESCRIPTION

Accelerator/Emulator environments are often used to verify the performance of processors and other circuits. This environment allows running long and complex performance benchmarks. But at the same time detecting performance bugs is harder due to limited visibility into the simulation. This presents a need for novel methods to detect performance bugs using the tools available in accelerator/emulator environment. One such tool available is breakpoints.

Figure 1:
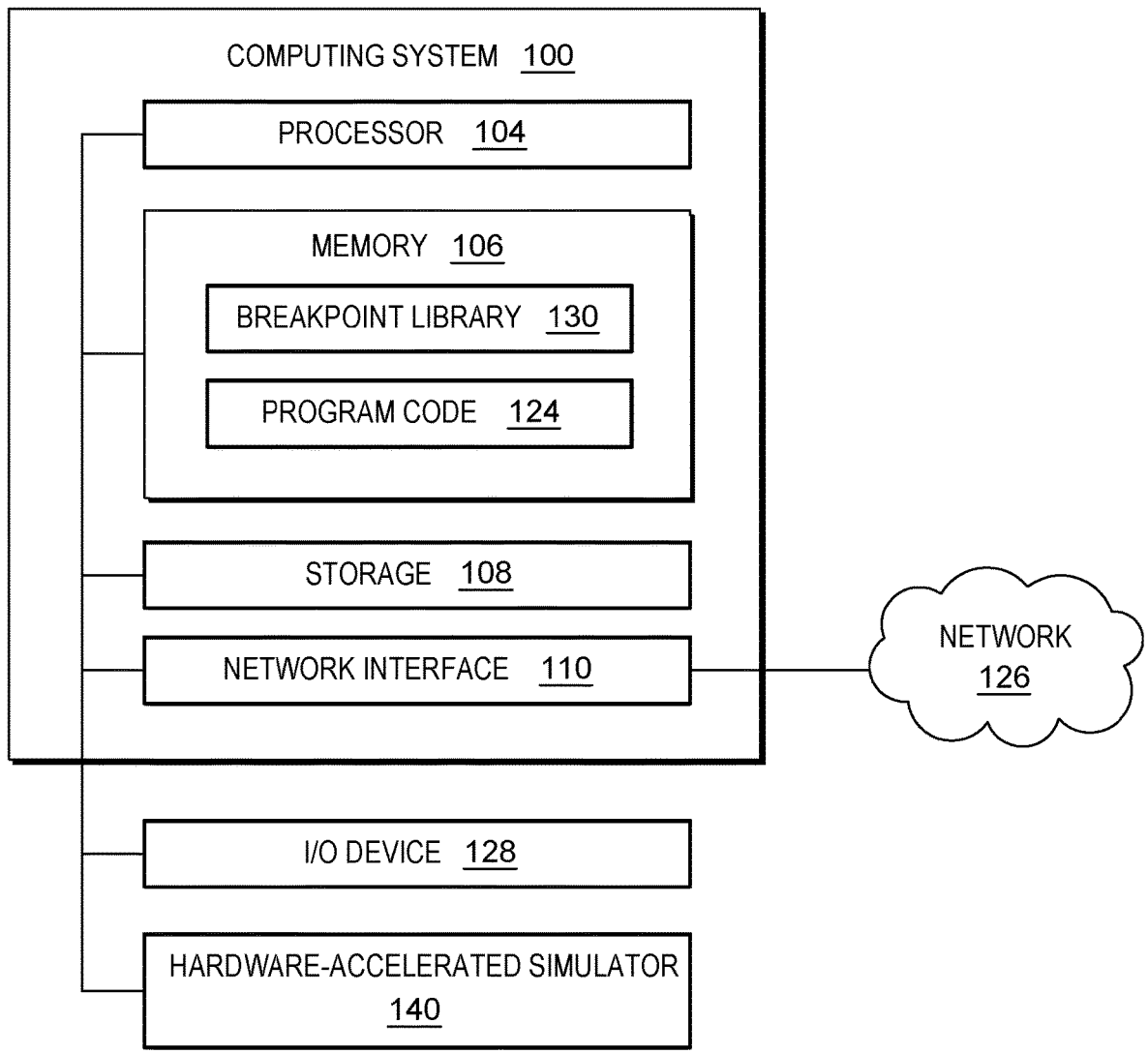
FIG. 1 is a block diagram illustrating a computing system in accordance with an embodiment of the invention.

FIG. 1 is a block diagram illustrating a computing system 100, according to one embodiment disclosed herein. The computing system 100 includes a processor 104, memory 106, storage 108, and a network interface 110. The processor 104 retrieves and executes programming instructions stored in memory 106 as well as stores and retrieves application data residing in the cache 112. The processor 104 is included to be representative of a single processor, multiple processors, a single processor having multiple processing cores, and the like. The storage 108 may be a disk drive storage device. Although shown as a single unit, the storage 108 may be a combination of fixed and/or removable storage devices, such as fixed disk drives, removable memory cards, optical storage, network attached storage (NAS), or storage-area-network (SAN). The network interface 110 may be any type of network communications allowing the computing system 100 to communicate with other computers via a network 126. The computing system 100 also includes an I/O device 128 (e.g. keyboard and mouse devices) connected to the computing system 100.

FIG. 1 further shows a hardware-accelerated simulator 140 connected to computing system 100. The hardware-accelerated simulator 140 is configured to simulate an execution of a circuit design using test bench code. The hardware-accelerated simulator 140 is a special-purpose machine that can be programmed by loading its memory with an instruction stream produced prior to simulation by a compiler that schedules each logical primitive at a specific time on a specific processor. In some embodiments, the hardware-accelerated simulator may be comprised of one or more Application-Specific Integrated Circuit (ASIC), Field Programmable Gate Array (FPGA), or the like. Compared to software-only-based simulators, hardware-accelerated simulator 140 provides a level of simulation performance necessary to perform end-to-end system level checking for modern system-on-chip designs with a reasonable turn-around period for a simulate-debug-fix-rebuild-rerun cycle.

The memory 106 includes program code 124 instructions for application(s) and a breakpoint controller 130. The breakpoint controller 130 is configured to store breakpoints for pausing the hardware-accelerated simulator 140 during simulation. The breakpoint controller 130 bridges the gap between the system level (or lower level) of the hardware-accelerated simulator 140 and the application level (or higher level) test bench code. This allows the hardware-accelerated simulator 140 to achieve close to maximum performance because, unlike software simulators where test bench code is evaluated after each simulation cycle, this solution can execute test bench code at sparse intervals (triggered by the breakpoints) of system level checks or monitors. In one embodiment, the breakpoint controller 130 can be implemented by a library layer used by the test bench code.

Figure 2:
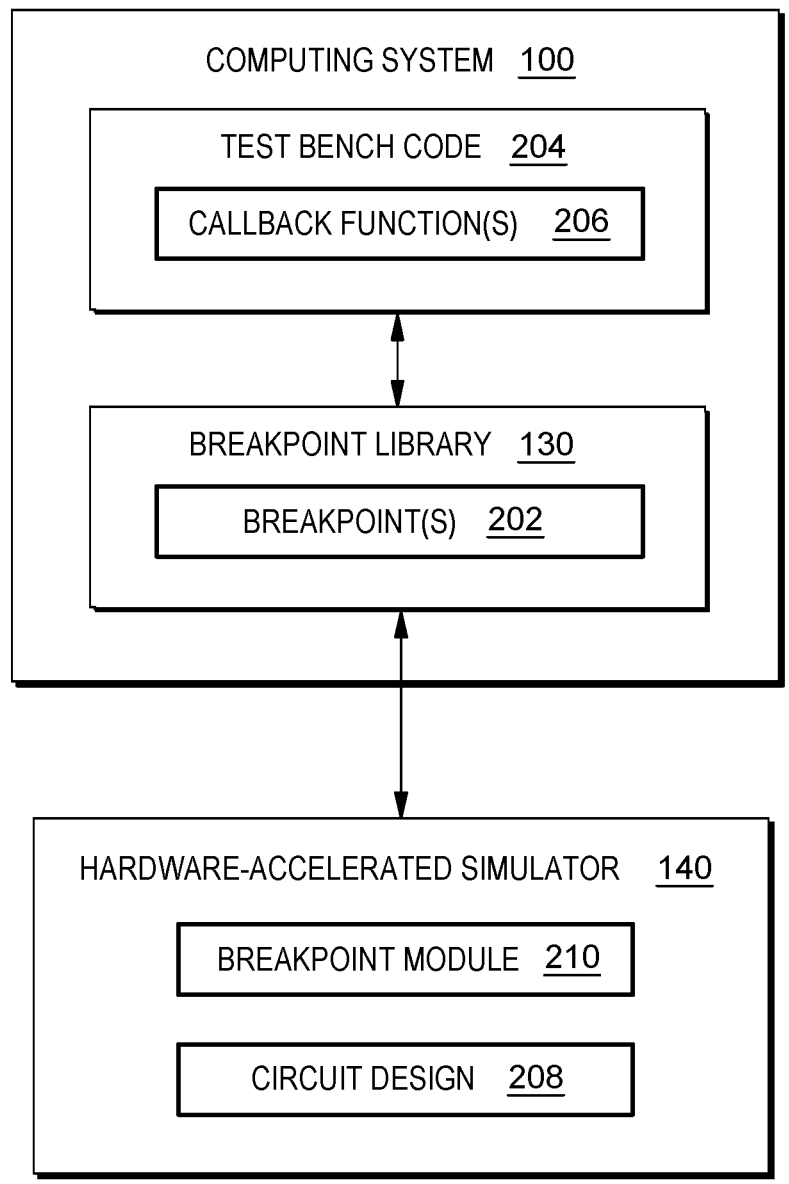
FIG. 2 illustrates a block diagram of the computing system of FIG. 1 interacting with a hardware-accelerated simulator according to an embodiment of the invention.

FIG. 2 illustrates a block diagram of the computing system 100 interacting with the hardware-accelerated simulator 140, according to one embodiment of the invention. Although hardware-accelerated simulators provide an increased level of simulation performance, executing typical unit-level software test bench code on a hardware-accelerated environment leads to inefficiencies in utilizing the full extent of the simulation performance offered by the hardware-accelerated simulator 140. Using the breakpoint controller 130 in the computing system 100 bridges the gap between the lower-level hardware-accelerated simulator 140 and the higher-level test bench code.

The computing system 100 includes the breakpoint controller 130 and software test bench code 204. The breakpoint controller layer 130 maintains one or more breakpoints 202 associated with simulation of a circuit design 208. The breakpoints 202 may be set by the user, for example, by execution of the test bench code 204 invoking an application programming interface (API) exposed by the breakpoint controller 130. In one embodiment, breakpoints 202 may include timed breakpoints, facility breakpoints, event listeners, and the like.

The software test bench code 204 includes checking and monitoring code written by a user and when executed by the computing system 100, are configured to test the circuit design 208, e.g., verify that the circuit design 208 adheres to a particular specification. In one or more embodiments, the software test bench code 204 includes a plurality of callback functions 206 associated with the breakpoints 202 in the breakpoint controller 130. User code functions are registered via the library 130 to be called when a certain event has become active. These functions can contain the checking and monitoring code, and the user may associate a specific callback function 206 with a specific breakpoint that executes when the breakpoint occurs.

The hardware-accelerated simulator 140 includes a breakpoint module 210 and the circuit design 208. A circuit design 208 is a functional definition of an electronic circuit, e.g., a target processor, chip, integrated circuit (IC) or other hardware product. The circuit design 208 may be provided in a computer-readable form using any hardware description language (HDL) including but not limited to VHDL, Verilog, SystemC, EDL, RTL, PSL or the like. The circuit design 208 can be loaded into the hardware-accelerated simulator 140 to simulate operation of the circuit design 208.

The breakpoint module 210 is configured to provide simulator-level breakpoint functionality, which is triggered by a value change in an observed design signal. In one or more embodiments, the breakpoint module 210 is configured to communicate with the breakpoint controller 130 when a breakpoint within the hardware-accelerated simulator occurs. When a breakpoint occurs, the breakpoint module 210 pauses the hardware-accelerated simulator 140 so that control can be transferred from the system-level hardware-accelerated simulator 140 to the application-level execution of test bench code 204 for handling.

One type of simulator breakpoints are timed breakpoints, which occur in the hardware-accelerated simulator 140 when a preset number of simulation cycles has elapsed. Facility breakpoints occur when a design signal changes value. In some embodiments, access to the breakpoint module 210 may be provided by a lower level breakpoint application program interface (API). Whenever a simulator breakpoint or a breakpoint from a lower level breakpoint API occurs, the hardware-accelerated simulator 140 will pause and return control to the software test bench code being executed on the host platform (computing system 100) attached to the hardware-accelerated simulator 140.

Figure 3:
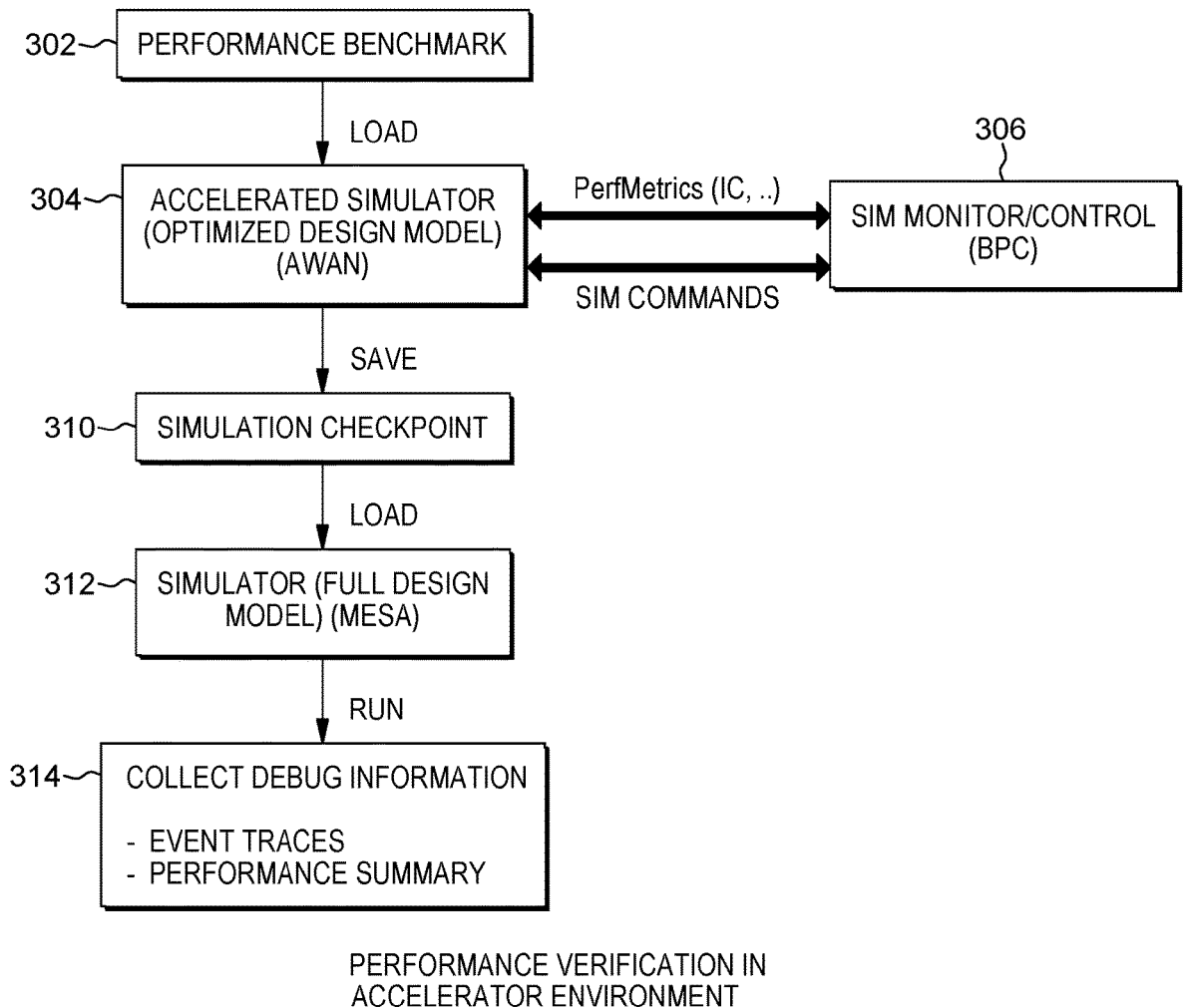
FIG. 3 shows a process flow for performance verification in an accelerator environment.

FIG. 3 illustrates a process flow, in accordance with an embodiment of the invention, for performance verification in an accelerator environment. At 302, performance benchmarks are identified and loaded onto the simulator. A wide variety of performance benchmarks can be used in embodiments of the invention, and for example, IPC (Instructions per Cycle) and bandwidth may be used.

At 304, the performance metrics are periodically monitored during accelerated simulation of the circuit design. During this monitoring, the performance metrics are sent to a Sim Monitor/Control (BPC) 306, and sim commands are sent from the sim Monitor/Control (BPC) 306 to the accelerated simulator.

These measured values are compared to preset target values. Any deviation from the target value that exceeds a tolerance will trigger a simulation checkpoint save 310. At the checkpoint save, a snapshot of the simulation state is saved. These saved checkpoints can be used to reproduce the behavior of the circuit design in simulation (full design model) (MESA) 312. Also, at 314, debug information is collected. This debug information may include, for example, event traces and performance summaries.

Figure 4:
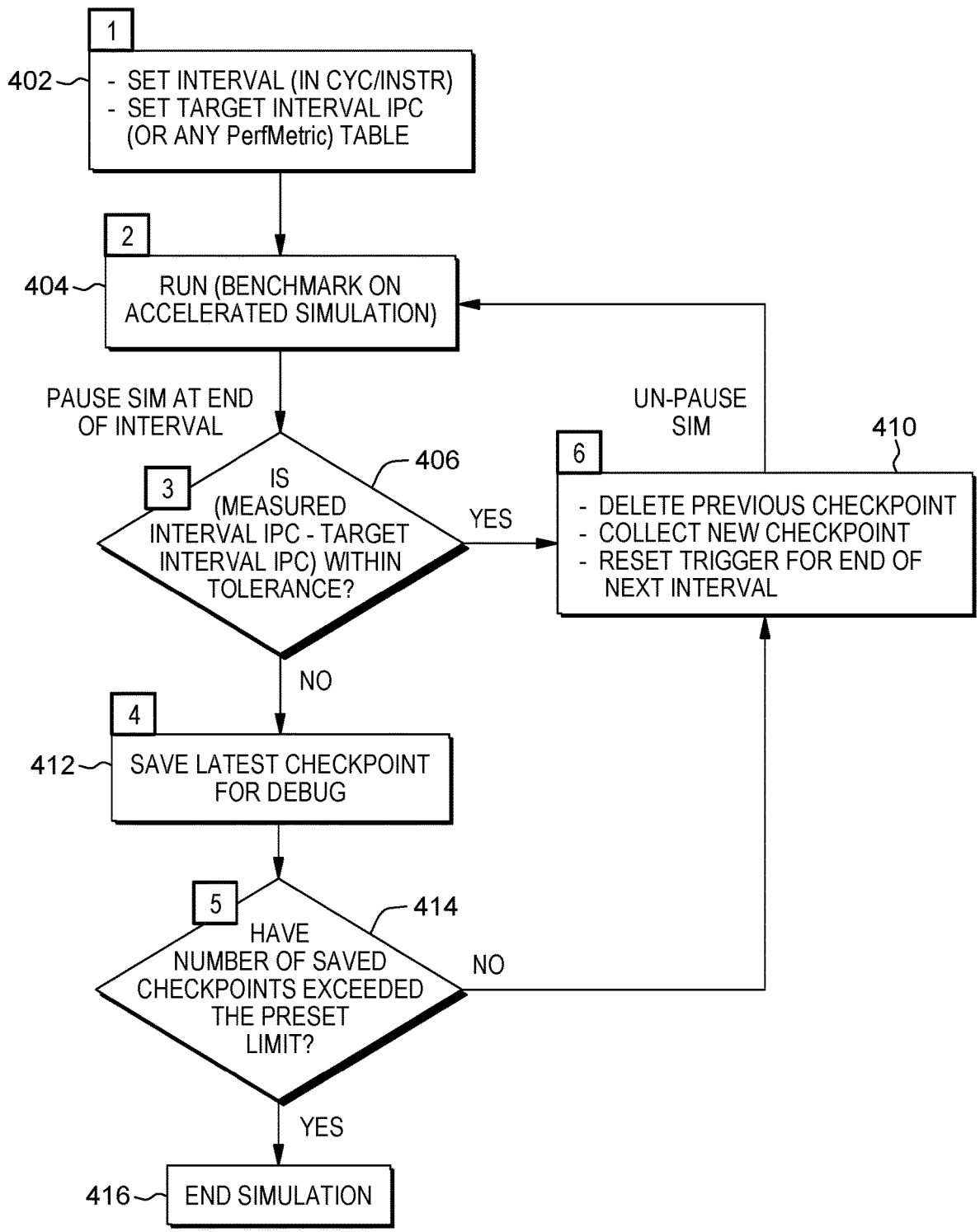
FIG. 4 illustrates an algorithm for triggering performance checkpoints in embodiments of the invention.

Embodiments of the invention are used to detect performance bugs in accelerated simulation environment. The procedure is summarized in the flowchart of FIG. 4. At 402, Step 1 is to create a list of target values for each performance metric per interval. Intervals are either based on cycles or instructions. At 404, Step 2 is to setup a breakpoint to pause the simulation at the end of each interval and trigger the performance metric compare. The type of breakpoint used depends on the choice between cycle and instruction count based intervals. Cycle based intervals use timed breakpoints, and instruction count based intervals use facility breakpoints. At 406, Step 3, at the end of each interval, the performance metrics (like IPC, bandwidth) are read from the simulation. This measured value is compared to the target value for this interval (from, for example, a table created at Step 1). If the difference between the measured value and the target value is within a preset tolerance, the process goes to Step 6 410. If, however, at Step 3, the performance check fails, at 412, Step 4, the checkpoint that was collected at the start of this interval is saved.

The process keeps track of the number of checkpoints being saved. At 414, Step 5, if the number of saved checkpoints exceeds a preset limit, the simulation is ended, at 416, and marked as a fail. This avoids overloading the simulation environment with saved checkpoints. If at Step 5, the number of saved checkpoints does not exceed the preset limit, the process goes to Step 6. At Step 6, the previous checkpoint is deleted. Also, a new checkpoint is collected before the start of the next interval, the breakpoint trigger is reset, and the simulation continues to run.

As mentioned above, a wide variety of performance metrics can be used for monitoring. For example, in embodiments of the invention, the performance metrics include IPC (Instructions Per Cycle (IPC=Number of instructions completed/Number of processor clock cycles)) and bandwidth (bandwidth(read/write)=Number of Bytes read/write from memory/Number of processor clock cycles).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The description of the invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and applications of the invention, and to enable others of ordinary skill in the art to understand the invention. The invention may be implemented in various embodiments with various modifications as are suited to a particular contemplated use.

The invention claimed is:

1. A method comprising:
    loading a list of target values for a performance metric onto a hardware-accelerated simulator;
    setting breakpoints to pause the hardware-accelerated simulator at defined intervals;
    simulating, by the hardware-accelerated simulator, execution of a circuit design including collecting a checkpoint of the execution of the circuit design at a start of each defined interval;
    during the simulating, using said breakpoints to pause the simulating at the defined intervals, and during each pause, comparing a measured value for the performance metric to the target value for the performance metric;
    deleting, in response to the difference between the measured value for the performance metric and the target value for the performance value is within a preset tolerance, the collected checkpoint; and
    ending the simulation when a specified condition based on said comparing is met.

2. The method according to claim 1, wherein:
    the comparing a measured value for the performance metric to the target value for the performance metric includes
    at an end of each of the intervals, comparing the measured value for the performance metric to the target value for the performance metric, and
    when the difference between the measured value for the performance metric and the target value for the performance metric is within the preset tolerance, ending the each pause and continuing the simulating execution of the circuit design.

3. The method according to claim 1, wherein the comparing a measured value for the performance metric to the target value for the performance metric further includes:
    when the difference between the measured value for the performance metric and the target value for the performance metric is outside the preset tolerance,
    incrementing a count,
    comparing the incremented count to a preset limit, and
    when the incremented count does not exceed the preset limit, ending the each pause and continuing the simulating execution of the circuit design.

4. The method according to claim 3, wherein the ending the simulation when a specified condition based on said comparing is met includes ending the simulation when the incremented count exceeds the preset limit.

5. The method according to claim 3, wherein the simulating, by the hardware-accelerated simulator, execution of a circuit design further includes when the difference between the measured value for the performance metric and the target value for the performance metric is outside the preset tolerance, saving the collected checkpoint.

6. The method according to claim 5, wherein the incrementing a count includes keeping track of a number of the saved checkpoints.

7. The method according to claim 6, wherein the ending the simulation when a specified condition based on said comparing is met includes ending the simulation when the number of the saved checkpoints exceeds the preset limit.

8. The method according to claim 1, wherein the comparing a measured value for the performance metric to the target value for the performance metric includes using the breakpoint to trigger the comparing.

9. The method according to claim 1, wherein:
    the comparing a measured value for the performance metric to the target value for the performance metric includes keeping a count of a number of times a difference between the measured value for the performance metric and the target value for the performance metric is more than a preset tolerance; and
    the ending the simulation when a specified condition based on said comparing is met includes ending the simulation when said count exceeds a preset limit.

10. A system comprising:
    a processor; and
    a memory, storing program code, which when executed on the processor, performs an operation of circuit design verification, the operation comprising:
        loading a list of target values for a performance metric onto a hardware-accelerated simulator;
        setting breakpoints to pause the hardware-accelerated simulator at defined intervals;
        simulating, by the hardware-accelerated simulator, execution of a circuit design including collecting a checkpoint of the execution of the circuit design at a start of each defined interval;
        during the simulating, using said breakpoints to pause the simulating at the defined intervals, and during each pause, comparing a measured value for the performance metric to the target value for the performance metric;

deleting, in response to the difference between the measured value for the performance metric and the target value for the performance value is within a preset tolerance, the collected checkpoint; and ending the simulation when a specified condition based on said comparing is met.

11. The system according to claim 10, wherein:

the comparing a measured value for the performance metric to the target value for the performance metric includes at an end of each of the intervals, comparing the measured value for the performance metric to the target value for the performance metric, and when the difference between the measured value for the performance metric and the target value for the performance metric is within the preset tolerance, ending the each pause and continuing the simulating execution of the circuit design.

12. The system according to claim 11, wherein the comparing a measured value for the performance metric to the target value for the performance metric further includes:

when the difference between the measured value for the performance metric and the target value for the performance metric is outside the preset tolerance, incrementing a count, comparing the incremented count to a preset limit, and when the incremented count does not exceed the preset limit, ending the each pause and continuing the simulating execution of the circuit design.

13. The system according to claim 10, wherein the ending the simulation when a specified condition based on said comparing is met includes ending the simulation when the incremented count exceeds the preset limit.

14. A computer readable storage medium having stored thereon instructions that when executed by a processor causes the processor to perform an operation for circuit design verification, comprising:

loading a list of target values for a performance metric onto a hardware-accelerated simulator;

setting breakpoints to pause the hardware-accelerated simulator at defined intervals;

simulating, by the hardware-accelerated simulator, execution of a circuit design including collecting a checkpoint of the execution of the circuit design at a start of each defined interval;

during the simulating, using said breakpoints to pause the simulating at the defined times, and during each pause, comparing a measured value for the performance metric to the target value for the performance metric;

deleting, in response to the difference between the measured value for the performance metric and the target value for the performance value is within a preset tolerance, the collected checkpoint; and ending the simulation when a specified condition based on said comparing is met.

15. The computer readable storage medium according to claim 14, wherein:

the setting breakpoints to pause the hardware-accelerated simulator at defined intervals includes setting the breakpoints to pause the hardware-accelerated simulator at ends of the defined intervals; and the comparing a measured value for the performance metric to the target value for the performance metric includes at the end of each of the intervals, comparing the measured value for the performance metric to the target value for the performance metric, and when the difference between the measured value for the performance metric and the target value for the performance metric is within the preset tolerance, ending the each pause and continuing the simulating execution of the circuit design.

16. The computer readable storage medium according to claim 14, wherein the comparing a measured value for the performance metric to the target value for the performance metric further includes:

when the difference between the measured value for the performance metric and the target value for the performance metric is outside the preset tolerance, incrementing a count, comparing the incremented count to a preset limit, and when the incremented count does not exceed the preset limit, ending the each pause and continuing the simulating execution of the circuit design.

17. The computer readable storage medium according to claim 16, wherein the ending the simulation when a specified condition based on said comparing is met includes ending the simulation when the incremented count exceeds the preset limit.

* * * * *